(12) United States Patent
Resnick et al.

(10) Patent No.: US 9,425,019 B1
(45) Date of Patent: Aug. 23, 2016

(54) INTEGRATED FIELD EMISSION ARRAY FOR ION DESORPTION

(71) Applicants: Sandia Corporation, Albuquerque, NM (US); Christopher Holland, San Jose, CA (US); David Chichester, Idaho Falls, ID (US)

(72) Inventors: Paul J. Resnick, Albuquerque, NM (US); Kristin L. Hertz, Livermore, CA (US); Christopher Holland, San Jose, CA (US); David Chichester, Idaho Falls, ID (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/640,655

(22) Filed: Mar. 6, 2015

Related U.S. Application Data

(62) Division of application No. 14/028,294, filed on Sep. 16, 2013, now abandoned, which is a division of application No. 13/246,985, filed on Sep. 28, 2011, now Pat. No. 8,536,564.

(51) Int. Cl.
*H01L 29/06* (2006.01)
*H01J 9/02* (2006.01)
*H01L 21/311* (2006.01)

(52) U.S. Cl.
CPC ............. *H01J 9/02* (2013.01); *H01L 21/31111* (2013.01)

(58) Field of Classification Search
CPC ......... H01J 19/24; H01J 1/3044; H01J 9/025; H01J 2201/319; H01J 1/304; H01J 1/34; H01J 2201/304; H01J 2201/30457; H01J 9/12
See application file for complete search history.

(56) References Cited

U.S. PATENT DOCUMENTS

| | | | |
|---|---|---|---|
| 5,319,279 A * | 6/1994 | Watanabe | H01J 3/022 313/309 |
| 5,534,743 A | 7/1996 | Jones et al. | |
| 5,717,279 A | 2/1998 | Imura | |
| 6,204,596 B1 | 3/2001 | Macaulay et al. | |
| 6,329,214 B1 | 12/2001 | Hattori et al. | |
| 8,384,281 B2 | 2/2013 | Yamamoto et al. | |
| 2003/0057861 A1* | 3/2003 | Williams | H01J 3/022 315/169.3 |
| 2007/0085459 A1* | 4/2007 | Hudspeth | H01J 9/025 313/309 |
| 2008/0129711 A1 | 6/2008 | Wilson et al. | |

OTHER PUBLICATIONS

An integrated field emission array for ion desorption, P.J. Resnick et al., Nov. 15, 2009.*

(Continued)

*Primary Examiner* — Duy T Nguyen
(74) *Attorney, Agent, or Firm* — Martin I. Finston

(57) ABSTRACT

An integrated field emission array for ion desorption includes an electrically conductive substrate; a dielectric layer lying over the electrically conductive substrate comprising a plurality of laterally separated cavities extending through the dielectric layer; a like plurality of conically-shaped emitter tips on posts, each emitter tip/post disposed concentrically within a laterally separated cavity and electrically contacting the substrate; and a gate electrode structure lying over the dielectric layer, including a like plurality of circular gate apertures, each gate aperture disposed concentrically above an emitter tip/post to provide a like plurality of annular gate electrodes and wherein the lower edge of each annular gate electrode proximate the like emitter tip/post is rounded. Also disclosed herein are methods for fabricating an integrated field emission array.

3 Claims, 7 Drawing Sheets

(56) References Cited

OTHER PUBLICATIONS

Cruz, D. et al., "Design, microfabrication, and analysis of micrometer-sized cylindrical ion trap arrays", Review of Scientific Instruments 78, 015107-015107-9 (2007); doi: 10.1063/1.243840.

Flemming, J.G., et al., "All-metallic three-dimensional photonic crystals with a large infrared bandgap", Nature, 417, May 2002, pp. 52-55.

Resnick, et al., "An Integrated field emission array for ion desorption", Microselectronic Engineering 87, 2010, pp. 1263-1265.

* cited by examiner

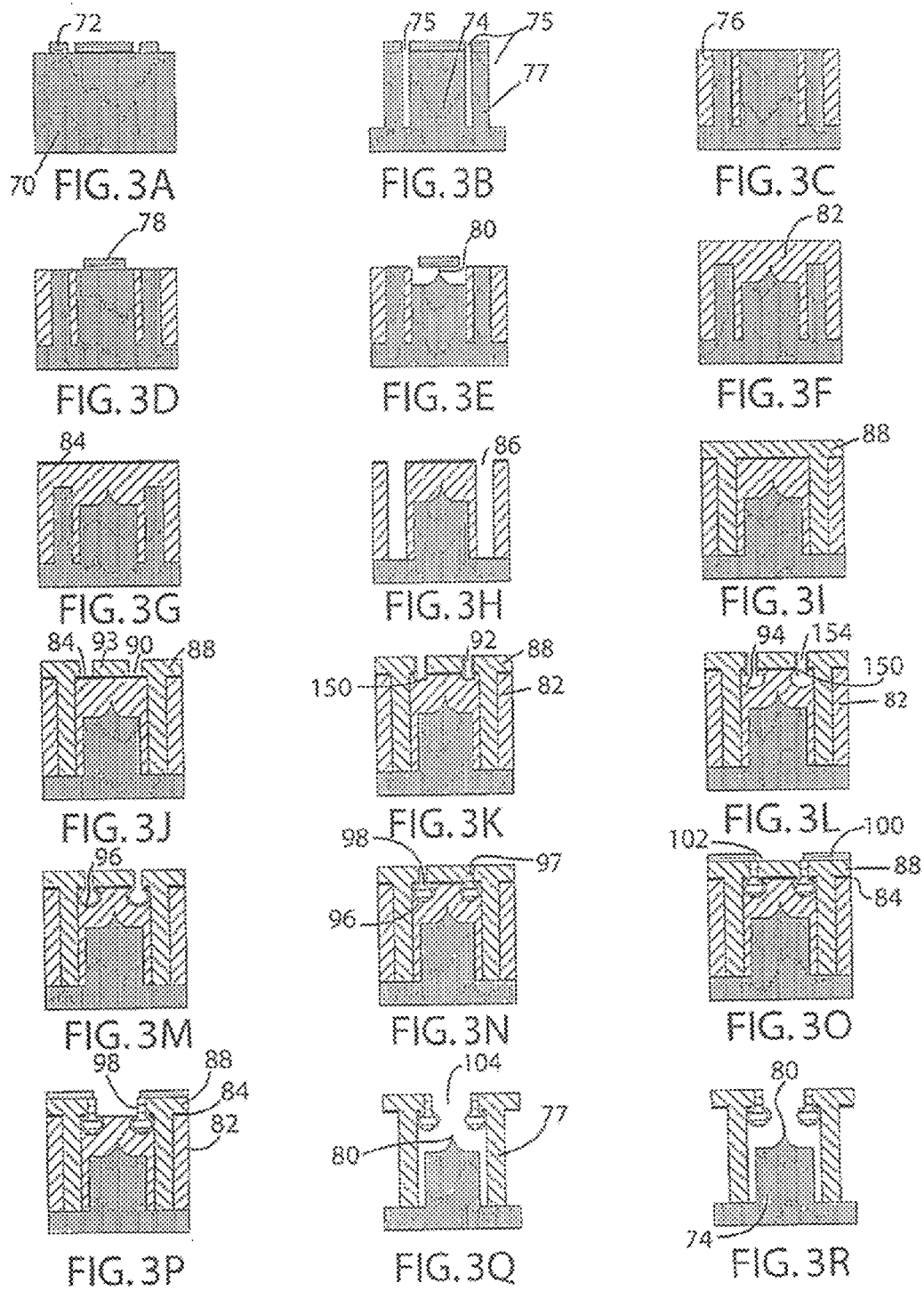

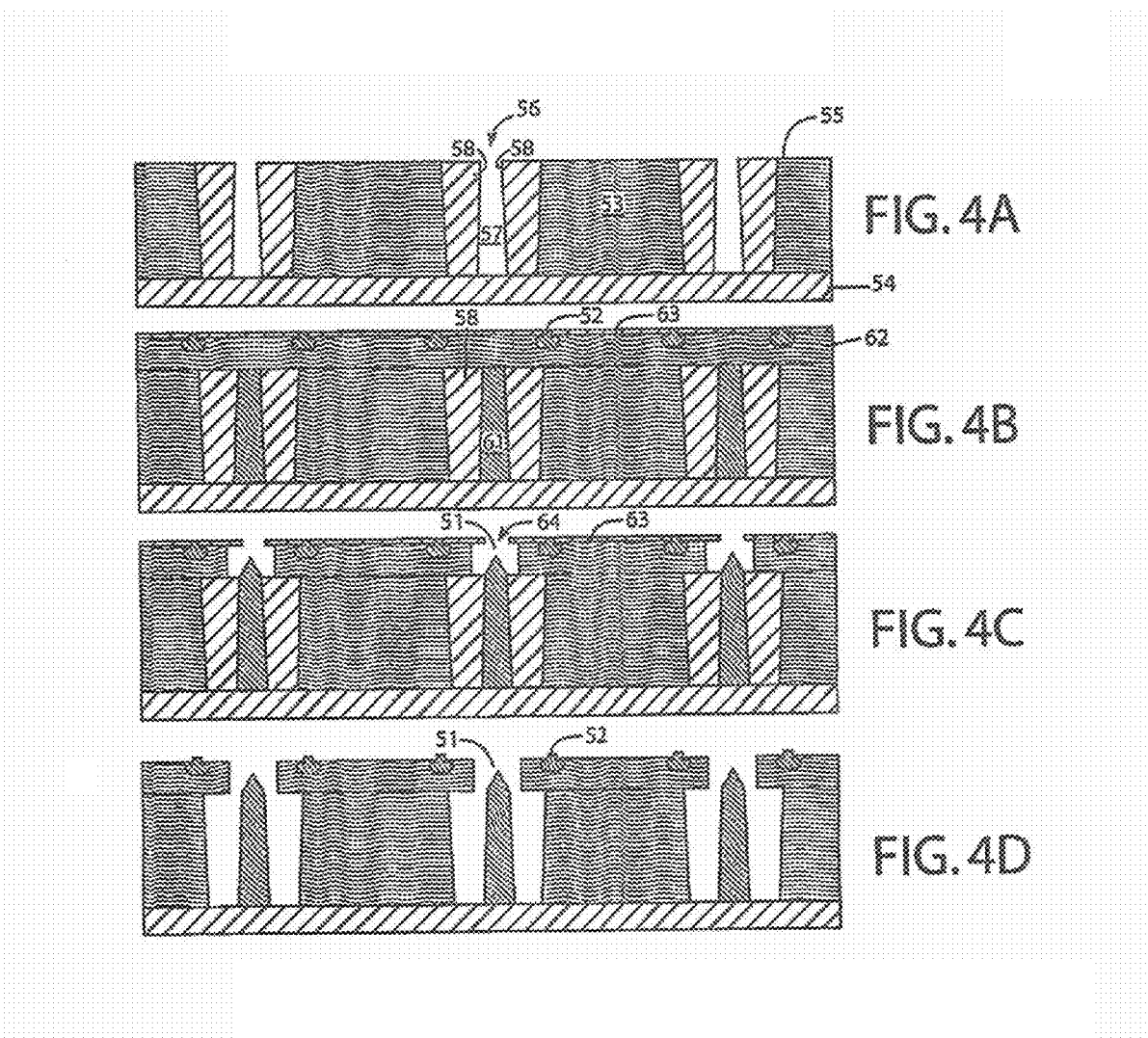

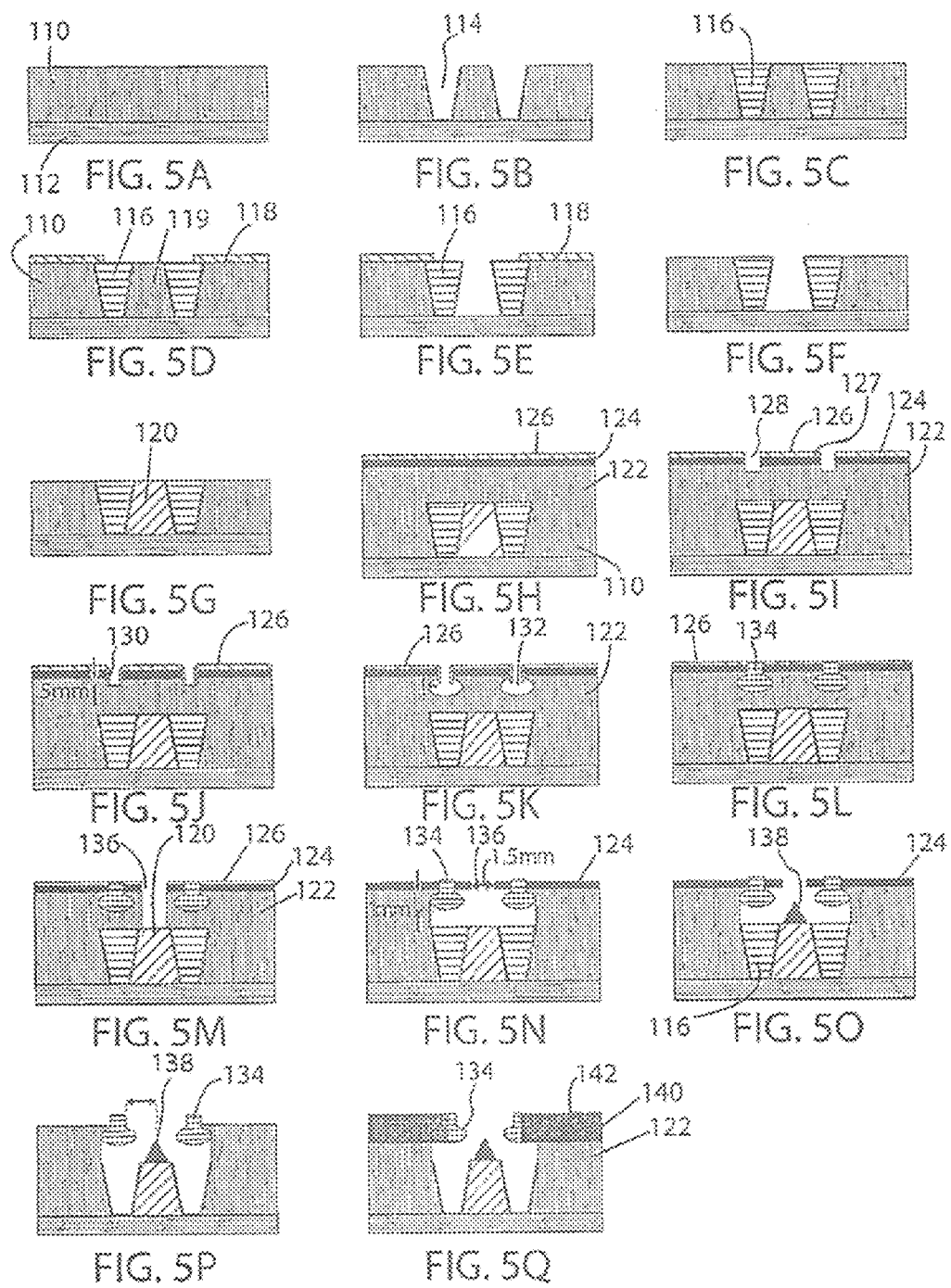

INTEGRATED FIELD EMISSION ARRAY FOR ION DESORPTION

CROSS-REFERENCE TO RELATED APPLICATIONS

This application is a Divisional of U.S. patent application Ser. No. 14/028,294 entitled INTEGRATED FIELD EMISSION ARRAY FOR ION DESORPTION and filed on Sep. 16, 2013, which is a Divisional of U.S. patent application Ser. No. 13/246,985 entitled INTEGRATED FIELD EMISSION ARRAY FOR ION DESORPTION and filed on Sep. 28, 2011. Both said applications are incorporated herein by reference in entirety.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to field emission arrays and, in particular, to an integrated field emission array for ion desorption and methods to fabricate the array.

BACKGROUND OF THE INVENTION

Field emission arrays (FEA) for ion desorption present unique challenges for microfabrication. Unlike arrays that are used for field emission of electrons, devices that are designed for ion emission desirably support the high voltages needed to achieve electrostatic field desorption. See C. A. Spindt et al., IEEE Trans. Electron Devices 38 (10), 2355 (1991). The onset of field ionization occurs when the field at the tip reaches about 10 V/nm, which is about 10 times greater than the field required for electron emission. Ion desorption occurs at fields of about 20 V/nm. See D. L. Chichester et al., NIM B (261), pp. 835-838 (2007). To achieve these high fields, even with ultra-sharp tips, applied voltages greater than 1 kV are typically used. To prevent high voltage breakdown, a thick dielectric film between the gate and substrate may be used, which is somewhat incongruous with microfabrication processes. Finally, intense electric fields at the gate can initiate electron emission, which often results in catastrophic failure.

SUMMARY OF THE INVENTION

The present invention is embodied in an integrated field emission array for ion desorption. Field emission arrays that are used for ion desorption typically operate at high applied voltages. The large electric fields can lead to dielectric breakdown or electron emission from the gate, both of which may result in catastrophic failure. To create a high electric field at the tip while suppressing electron emission from the gate, the ratio of gate radius to tip radius is maximized to the extent that fabrication methods allow. The ratio of the field at the tip to the field at the gate is increased by using a gate having a larger radius at its lower edge. In particular, sharp corners at the gate electrode are eliminated to minimize electric field concentrators. A damascene gate, integrated into the device structure, provides a method to minimize field concentrators associated with sharp corners at the gate. Such processing is compatible with tips that are either etched out of silicon or deposited through a sacrificial mask.

The methods of the present invention enable fabrication of tip arrays with integrated gate electrodes, separated from the substrate with sufficient dielectric strength to sustain high voltages. In particular, technologies that have been developed for microelectromechanical systems (MEMS) have been applied to the fabrication of field desorption arrays. These techniques include the use of thick films for enhanced dielectric stand-off, as well as an integrated gate electrode. The increased complexity of MEMS fabrication enables enhanced design flexibility over traditional methods.

As an example of the present invention, tips are etched from p-type degenerately doped silicon, with a sacrificial oxide ring around each tip-on-post structure. After tip formation, the surrounding silicon honeycomb is etched out using a DRIE process. The resulting trench is filled with silicon nitride to create a thick dielectric between the gate and substrate. To minimize field compression at the gate, a rounded lower corner is incorporated into the electrode, which is coated with a thin silicon nitride film. The support structure in which the gate is embedded is silicon nitride, fabricated with a deep trench process. Finally, the silicon tip is coated with a thin, conformal selective tungsten coating.

These methods have been combined to fabricate field emission arrays for deuterium ion desorption. This device requires high electric fields at the tip, and therefore is desirably capable of sustaining high applied voltages (>1 kV). These arrays have sustained applied voltages greater than 1 kV, and produced significant deuteron currents (>10 nA) through field ionization.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 3A-3R are cut-away side plan views that are useful to describe the fabrication of another exemplary silicon tip array according to the present invention;

FIGS. 4A-4D are cut-away side plan views that are useful to describe the fabrication of an exemplary tip on post array according to the present invention;

FIGS. 5A-5Q are cut-away side plan views that are useful to describe the fabrication of another exemplary silicon tip on post array according to the present invention;

DETAILED DESCRIPTION OF THE INVENTION

Field emission arrays (FEAs) have traditionally been fabricated using relatively simple thin film methods. See C. A Spindt, J. Appl. Phvs. 39 (7), 3504 (1968); and C. A. Spindt et al., IEEE Trans. Electron Devices 38 (10), 2355 (1991). The elegance of this approach is undeniable, but it may not be suitable for high voltage field ionization or desorption sources. High voltage devices use a thick dielectric between the gate and substrate, which can be difficult to accommodate with thin film methods. In reverse-bias operation for field desorption (or ionization), it is desirable to suppress electron emission from the gate and which may cause special consideration to be given to the shape and position of the gate.

Therefore, a need remains for ion desorption sources that can be fabricated using surface micromachining and related technologies. The additional complexity enabled by these methods allows for fabrication of arrays that can sustain high voltage and produce the high fields necessary for field ionization or ion desorption.

Figure 1A:
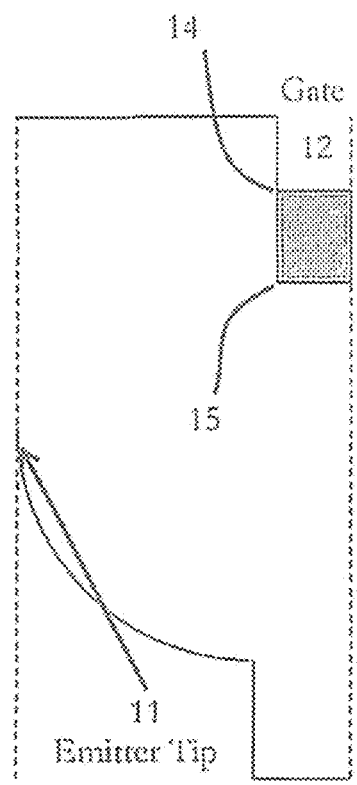
FIG. 1A is a finite element electric field simulation of an exemplary field emission structure with a square gate geometry.
Figure 1B:
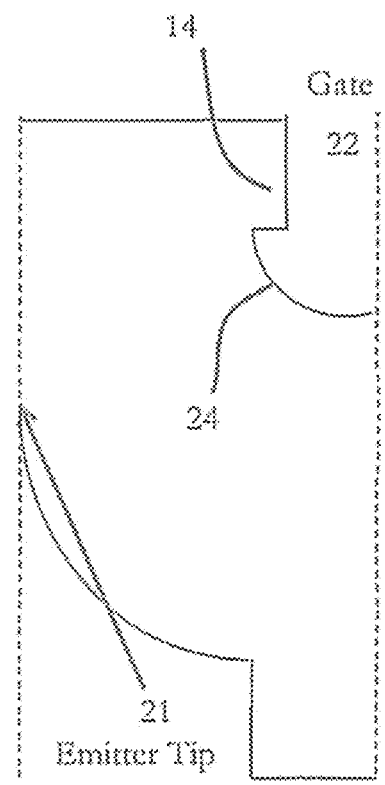
FIG. 1B is a finite element electric field simulation of an exemplary field emission structure with a rounded gate geometry.

Finite element analysis can be used to evaluate the electric field with various gate and tip geometries. The gate electrode diameter and the spacing from the tip to the gate can be studied, as well as the radius of the lower gate edge. FIG. 1 shows simulations of the electric field as a function of gate geometry. FIG. 1a shows a cone-shaped emitter tip 11 below a gate electrode 12 with a lower corner radius of 100 nm, on top of a dielectric 13. For these simulations, a large radius was chosen to simplify meshing, as well as providing a conservative scenario. The maximum field occurs at the triple point 14 (where metal, dielectric and vacuum surfaces meet), and significant field compression was also noted at the lower corner 15 of the dielectric, which may be undesirable. By comparison, FIG. 1b shows a similar tip geometry with a rounded lower edge 24 of the gate 22, where the radius of the gate 12 is greater than the radius of the emitter tip 11. For this case, there is no significant field compression at the gate 22, and the maximum field occurs at the emitter tip 21, where it is desired. These simulations assume a 100 nm tip radius, which is considerably larger than the many tip radii of exemplary tips according the present invention. However, for the purpose of evaluating the gate geometry, these values provide for an illustrative simulation.

Field Emission Array Fabrication

Exemplary embodiments of the present invention relates to a number of aspects of array fabrication for ion desorption sources, including: thick dielectric between the gate and substrate; silicon tip development; and gate electrode geometry.

Thick Dielectric: High voltage applications typically employ a thick dielectric between the gate electrode and substrate. However, the thickness of the dielectric cannot be increased arbitrarily in thin film approaches; thick films may impact subsequent processes (e.g., tip deposition). Additionally, the added stress caused by the thick films may render the substrates too bowed for further processing. To provide a thick dielectric stand-off without depositing an extremely thick film, a trench-fill process can be used with the present invention. A trench can be first etched into the substrate using deep reactive ion etching (DRIE), and subsequently filled with dielectric. DRIE is relatively easy to accomplish with modest aspect ratios. Conformal low pressure chemical vapor deposition (LPCVD) can be used to fill the trench with the dielectric. These steps can be repeated, possibly using different materials, to create a thick dielectric structure. This structure may also be somewhat immune to the consequences of film stress, as the majority of stress relief occurs normal to the substrate surface.

Silicon Tip Formation: Methods for fabricating silicon tips that rely on isotropic etching have been well documented, and can be implemented in a MEMS enabled process. See P. Neuzil and R. Nagarajan, J. Micromech. Microeng. 16, 1298 (2006). By incorporating a trench that is filled with a sacrificial dielectric film to isolate a tip/post structure, the isotropic tip etch can be confined to the post, thereby eliminating attack of the surrounding material. Very sharp tips can be fabricated using a single-etch process, but sharpening of tips can also be performed by oxidation or dry isotropic etching. A thin tungsten coating can be applied conformally to the tip/post using selective CVD tungsten deposition. A similar thin tungsten film, which is highly conformal and self-limiting in thickness, has been used in MEMS devices to suppress tribological wear. See S. S. Mani et al., Mat. Res. Soc. Symp. Proc. 605, 135 (2000).

Gate Electrode Geometry: To suppress electron emission from the gate during reverse bias operation at high potential, rounded gates can be fabricated using a tungsten damascene process. In this method, a trench is etched into a sacrificial film, filled with a structural material, and then polished back to the sacrificial material. A thin, conformal dielectric coating can be added to the gate to further suppress electron emission. Because a separate mask level is used to define the gate, the lateral distance from the tip can be defined by lithography; the vertical distance can be determined by the etch depth into the sacrificial film.

Damascene Process

A damascene process, designed to yield a rounded lower edge, has been developed and integrated into tip array fabrication techniques. Tungsten damascene processes have been previously used to fabricate devices such as ion traps and three-dimensional photonic crystals. See D. Cruz et al., Rev. Sci. Instrum. 78, 015107 (2007) 1-9; and J. G. Fleming et al., Nature 417, 52 (2002). However, these devices typically do not require smooth, rounded sidewalls for proper operation. Indeed, vertical sidewalls, with sharp corners are often desirable for these applications. But, the shape of the gate electrode can be tailored to create rounded lower corners by selecting the proper etch chemistry.

FIGS. 2A-2E illustrate an exemplary damascene process that can be used to fabricate an integrated field emission array. As will be described below, the first steps of this process define the emitter tip, etched from a degenerately doped silicon wafer. In order to provide adequate dielectric stand-off, the tips are etched from silicon posts Annular isolation trenches are first etched into the silicon substrate, wherein the inner walls of the trenches define a plurality of laterally separated posts 33, 36 and the other walls are concentric with the inner walls. The annular isolation trenches are subsequently filled with sacrificial oxide 35. The oxide overburden is then planarized using chemical-mechanical-polishing (CMP). A photoresist 34 is then applied to the planarized surface and patterned over the silicon post regions of the wafer.

Figure 2A:
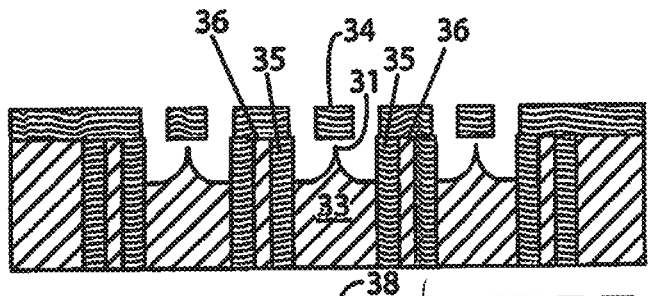
FIGS. 2A-2E are cut-away side plan views that are useful to describe the fabrication of an exemplary silicon tip array according to the present invention.

As shown in FIG. 2A, sharp tips 31 are etched out of the silicon posts 33 using an isotropic SF6/Ar dry etch under the patterned photoresist mask 34. See P. Neuzil and R. Nagarajan, J. Micromech. Microenq. 16, 1298 (2006). The oxide-filled isolation trenches 35 confine the isotropic etch to the silicon posts 33 and protect the field regions from attack. By confining the isotropic etch in this manner, emitter tip fabrication on top of an arbitrarily tall post is possible.

Figure 2B:
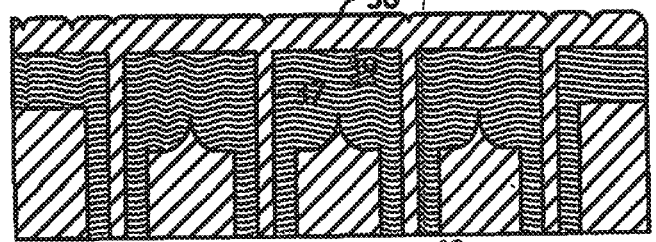

As shown in FIG. 2B, the photoresist 34 is then removed and an overburden of oxide 39 is deposited and planarized using CMP. The final oxide thickness after CMP determines the gap between the gate electrode 32 and the emitter tip 31. To form a support structure for the gate electrode structure, a combination oxide/silicon etch is used to remove the silicon 36 between the filled isolation trenches 35, followed by blanket deposition of low-stress (Si-rich) silicon nitride into the resulting trenches 37 and as a top layer 38 on the planarized oxide 39. The silicon-nitride filled trenches 37 have inner walls that are concentric with the silicon posts 33.

Figure 2C:
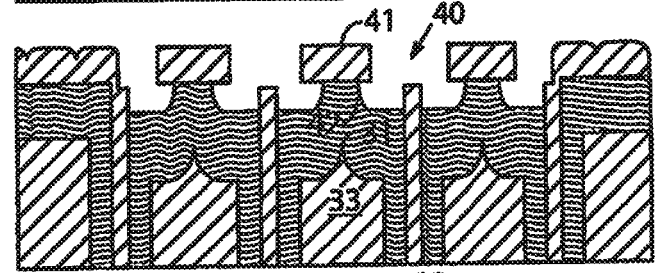

As shown in FIG. 2C, the silicon nitride top layer can be patterned by dry etching to provide an etch mask having openings 40 between the laterally-separated emitter tip/posts, leaving a circular cap 41 above each tip 31 and post 33. The rounded gate structure can then be formed by a liquid phase hydrofluoric (HF) acid etch into the oxide below. The extent of the undercut is determined by the etch time; for these short undercut distances, a linear etch rate can be assumed. The HF chemistry etches nearly isotropically into the oxide 39, thereby providing a rounded edge 42 in the mold below the circular cap 41.

Figure 2D:
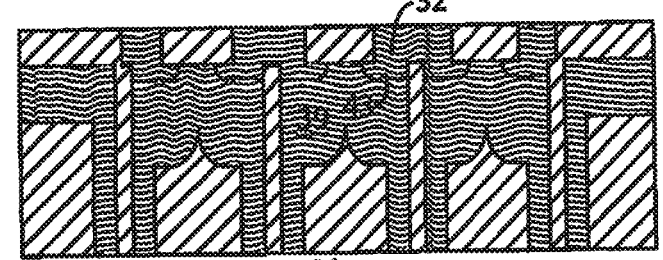

As shown in FIG. 2D, to further suppress electron emission from the gate, a silicon nitride liner 43 can be applied before tungsten 32 is deposited into the oxide mold. An extremely conformal chemical vapor deposition (CVD) process can be used to deposit the tungsten, but because CVD tungsten adheres poorly to oxide and nitride films, a thin sputtered titanium nitride film (not shown) may be deposited first. After tungsten is deposited into the oxide mold, excess tungsten material can be removed with CMP, stopping on the silicon nitride support film 38, to provide a planarized tungsten gate electrode structure comprising an annular gate electrode 32 having a rounded lower edge above each emitter tip/post 31/33.

Figure 2E:
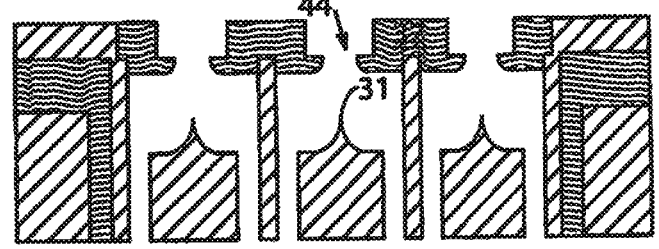

Finally, as shown in FIG. 2E, an aperture 44 can be opened in the gate structure by etching the silicon nitride 41 above the emitter tip 31. The sacrificial oxide 39 in which the tip/post is embedded can be stripped through the aperture 44 using HF, thereby releasing the silicon emitter tip/post 31/33 below the tungsten gate electrode 32. A thin tungsten coating can be applied conformally to the emitter tip/post using selective CVD tungsten deposition.

Figure 6:
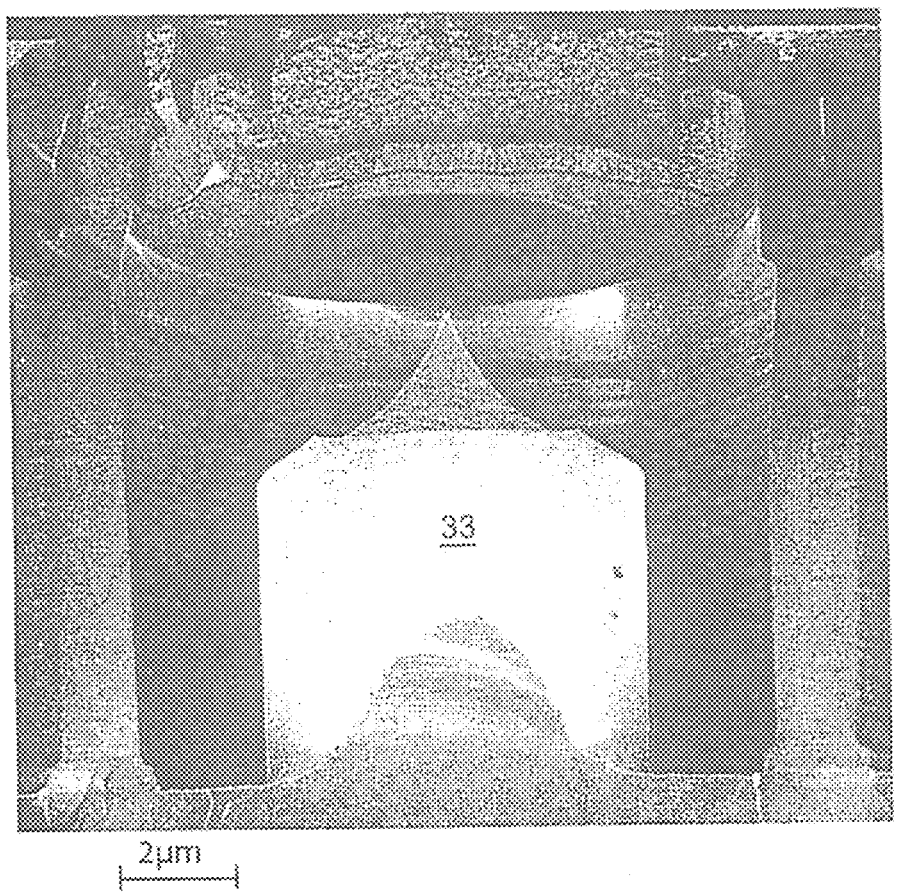
FIG. 6 is a scanning electron micrograph (SEM) of an exemplary silicon tip with integrated gate.

The methods described above have been used to fabricate field emission arrays with integrated, rounded gate electrodes. FIG. 6 is a drawing that illustrates a scanning electron micrograph (SEM) of the silicon tip device of FIGS. 2A-2E, in perspective sideview such that the bottom of the rounded gate electrode 32 is visible. The rough edge of the gate electrode is an artifact of sample preparation. In this exemplary device, the silicon post 33 and tip 31 have been selectively coated with conformal tungsten. See S. S. Mani et al., Mat. Res. Soc. Svm D. Proc. 605, 135 (2000); and P. J. Resnick and S. S. Mani, SPIE Proc. 4558, 181 (2001).

Figure 7A:
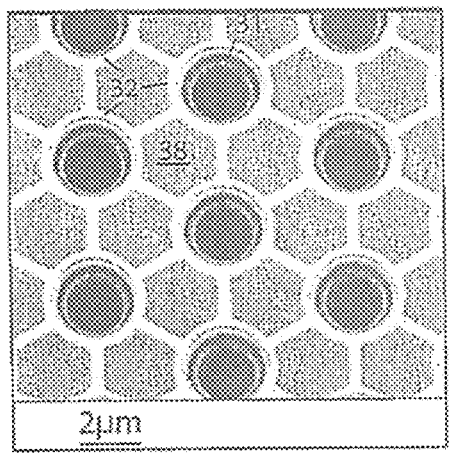
FIGS. 7A and 7B are top plan and cross-sectional photo micrographs representing SEMS of an exemplary silicon tip array of FIGS. 2A-2E.
Figure 7B:
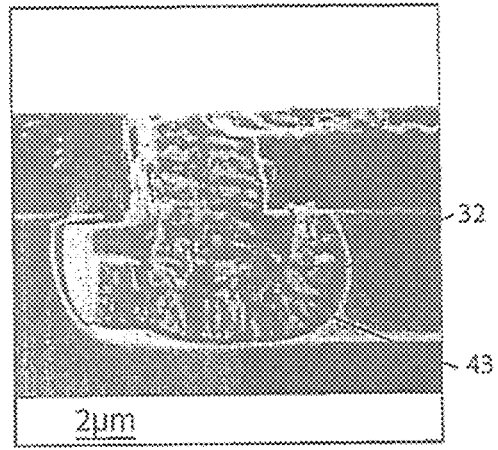

FIGS. 7A and 7B are top plan and cross-sectional views representing SEMS of the silicon tip array of FIGS. 2A-2E, which shows the interconnected gate electrodes 32. Tips 31 are visible in the center of each gate, well below the silicon nitride support structure 38. FIG. 7B is a cross-section of the rounded gate 32. A thin (e.g., 800 nm) silicon nitride liner 43 that surrounds the gate 32 is visible in this image.

FIGS. 3A-3R illustrate another silicon tip array fabrication method, according to another exemplary embodiment of the invention. As shown in FIG. 3A, a patterned photoresist mask 72 is deposited on a degenerately doped silicon wafer 70. In FIG. 3B, a deep reactive ion etch defines annular isolation trenches 75 in the wafer 70. The inner walls of the trenches 75 define laterally separated silicon posts 74 and 77. In FIG. 3C, an overburden of LPCVD sacrificial oxide 76 is deposited in the trenches 75 and the top surface of the wafer is planarized using CMP, thereby removing the photoresist mask 72.

In FIG. 3D, a photoresist mask 78 is applied to the central area of the top surface of the wafer. In FIG. 3E, a sharp tip 80 is etched out of the silicon post 74 using an isotropic dry etch under the photoresist mask 78. The photoresist mask 78 is stripped after the isotropic etch is complete. In FIG. 3F, an overburden of LPCVD sacrificial oxide 82 is deposited on top of wafer, and the top surface of the wafer is planarized using CMP. The sacrificial oxide 82 is a dielectric. In FIG. 3G, a thin (e.g., 200 nm) poly-silicon film 84 is applied to the top surface of the wafer, which will serve as an etch-stop film in subsequent processing. In FIG. 3H, a deep reactive ion etch, using the Bosch process, defines an annular isolation trench 86 in the poly-silicon film 84, the wafer 70 and the oxide 82.

In FIG. 3I, low-stress silicon nitride 88 is deposited on the top surface of the wafer, filling the isolation trench 86. In FIG. 3J, the silicon nitride 88 is dry etched to produce an annular recess 90 above the poly-silicon film 84. A circular cap 93 is encircled by the annular recess 90. In FIG. 3K, the poly-silicon film 84 residing below the annular recess 90 is dry etched by a dry, anisotropic etch to expose the oxide 82 below, thereby forming a deeper annular recess 92 having vertical sidewalls. A thin (e.g., 100 nm) polysilicon film 150 is conformally deposited over the surfaces of the recess 92. An anisotropic, blanket dry etch is used to strip the polysilicon film 150 from horizontal surfaces, leaving a polysilicon sidewall film 150 along the inner and outer edges of the annular recess 92, as shown. The polysilicon sidewall film 150 acts as a sidewall spacer.

In FIG. 3L, an isotropic (wet) etch process is used to form a deeper annular recess 154 defining a rounded gate edge 94. The presence of the sidewall film 150 forces the wet etchant to wrap around the sidewall film 150, resulting in a rounded shape to both the bottom and top edge of the gate electrode mold, as shown in FIG. 3L. After the isotropic etch for the gate mold is complete, the sidewall film 150 can be stripped with a brief isotropic silicon etch, e.g., using an NF3 downstream plasma. The annular recess 154 provides a mold for a gate electrode structure.

In FIG. 3M, a silicon nitride liner 96 is applied to the recess 154. In FIG. 3N, CVD tungsten 98 is deposited over top of the silicon nitride liner 96 in the recess 154, thereby forming the tungsten gate electrode 97. The top surface of the wafer is then planarized. In FIG. 3o, a patterned photoresist mask 100 is applied to the top surface of the wafer. The mask 100 is patterned on the top surface of the wafer to form a gate opening 102. In FIG. 3P, the nitride liner 88 and the film 84 that are circumscribed by the tungsten gate electrode 97 are dry etched, e.g., in a fluorocarbon plasma.

In FIG. 3Q, the sacrificial oxide 82 in which the tip/post 74/80 is embedded is stripped through the aperture 102 using HF, thereby releasing the silicon emitter tip/post 31/33 below the tungsten gate electrode 97. In FIG. 3R, a thin tungsten coating is applied conformally to the emitter tip/post 74/80 using selective CVD tungsten deposition.

The tungsten damascene gate can also be integrated into field emission arrays that are fabricated with deposited tips. The methods for depositing tips through a mask have been in use for many years and have been well documented elsewhere. See C. A. Spindt, J. Appl. Phvs. 39 (7), 3504 (1968). However, for high voltage applications, a thick dielectric film between the gate and the substrate is desirable to prevent break-down. Because the geometry of a deposited tip is dependent on the distance between the mask and the substrate, a thick stand-off cannot be readily made without impacting the quality of the tip.

Therefore, according to other methods of the present invention, to accommodate a thick dielectric film, a tungsten post can first be fabricated within a sacrificial polysilicon ring. For example, this structure can be embedded within a thick oxide film. The top of the post serves as the substrate surface for tip deposition. The thick oxide provides the needed dielectric gap, and the sacrificial material provides a vacuum break between the post and the oxide, once it is stripped. Exemplary fabrication methods are shown in FIGS. 4A-4D and 5A-5Q. The rounded gate electrodes of FIGS. 4A-4D and 5A-5Q are fabricated in a manner similar to the integrated silicon tip structure fabrication method described above.

Referring now to the fabrication method of FIGS. 4A-4D, as shown in FIG. 4A, annular isolation trenches are first etched into a thick oxide film 53 (e.g., 8 μm thickness) grown on a degenerately doped silicon substrate 54 and then back-filled with polysilicon 58. The polysilicon overburden is then planarized using chemical-mechanical-polishing (CMP). A silicon nitride layer 55 is blanket deposited on the planarized surface and patterned to provide openings 56 over the oxide post regions. An oxide etch is then used to remove the oxide in the central post region 57 of the annular polysilicon-filled isolation trenches 58.

As shown in FIG. 4B, CVD tungsten 61 can then deposited into post regions 57 in the polysilicon mold and the excess tungsten material can be removed with CMP. An overburden of oxide can be deposited and planarized using CMP. The thickness of the final oxide layer 62 after CMP determines the gap between the gate electrode 52 and the tip 51. An isotropic etch for rounding the gate can be performed using an HF chemistry through a patterned aluminum nitride (AlN) hard mask 63. Tungsten for the gate 52 can then be deposited using a conformal CVD process through the hard-mask openings into the gate electrode mold to provide an annular gate electrode having a rounded lower edge for each post 61.

As shown in FIG. 4C, the AlN mask 63 can then be again patterned to provide openings 64 for removal of the oxide above the tips. A brief etch will expose the top of the post and the sacrificial ring, leaving the gate embedded in dielectric, while a longer etch will expose the gate electrode as well. The tips 51 (e.g., molybdenum) are then deposited on the exposed top surface of each post through the mask openings 64 in a self-aligned manner. As shown in FIG. 4D, The AlN mask 63 can then be stripped with potassium hydroxide at the same time as the sacrificial polysilicon ring 58, releasing the gate electrode 52 suspended above the emitter tip 51.

Figure 7C:
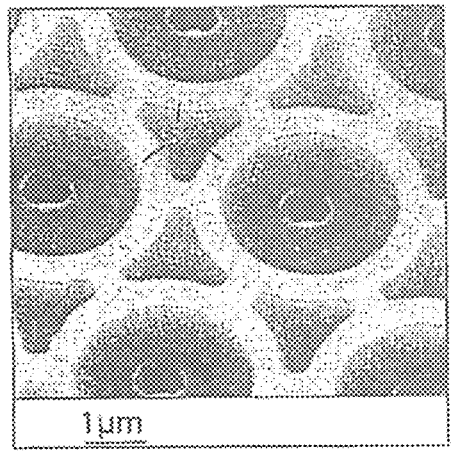
FIGS. 7C and 7D are top plan and perspective photo micrographs representing SEMS of an exemplary tungsten post array of FIGS. 4A-4D.
Figure 7D:
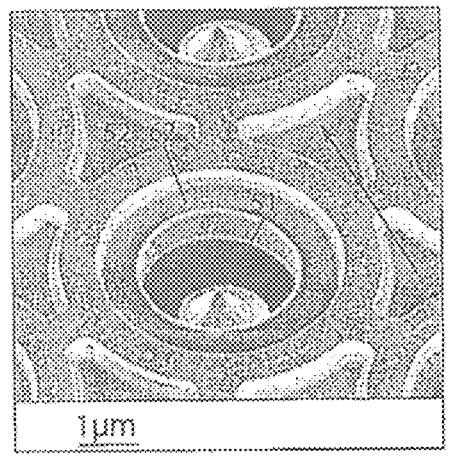

FIGS. 7C and 7D are top plan and perspective views representing SEMS of the tungsten post array of FIGS. 4A-4D. In FIG. 7C, the top layer is the AlN mask 63 through which the tips will be deposited. The damascene gate structure 52 has already been defined at this point in the process flow. FIG. 7D is a similar view after the tips 51 have been deposited on top of the tungsten post, and the AlN mask has been stripped. The support material for the gate 52 is oxide 62 ($SiO_2$), and the rounded undercut is visible as a shadow outside of the gate, shown by the arrow.

FIGS. 5A-5Q show another tip-on-post fabrication method, according to another exemplary embodiment of the invention. In FIG. 5A, an oxide film 110 is deposited, formed or grown on a degenerately doped silicon wafer 112. In FIG. 5B, an annular trench 114 is etched into the oxide film 110. In FIG. 5C, a sacrificial poly-silicon film 116 is deposited in the annular trench 114. The top surfaces of the oxide film 119 and the poly-silicon film 116 are then planarized to form a flat top surface. In FIG. 5D, a patterned low-stress silicon nitride layer 118 is deposited on top of the oxide film 110. In FIG. 5E, the oxide film 119 that is encapsulated by the poly-silicon film 116 is etched away by a dry or wet etch process. In FIG. 5F, the nitride layer 118 is stripped away by either planarization or an etching technique.

In FIG. 5G, CVD tungsten 120 is deposited over top of the silicon wafer 112 into the aperture of the poly-silicon film 116, thereby forming a tungsten post 120. The top surfaces of the oxide film 119 and the poly-silicon film 116 are then planarized to form a flat top surface. In FIG. 5H, oxide 122, aluminum nitride 124 and PE silicon nitride 126 are deposited on top of the oxide film 110. In FIG. 5I, an annular recess 128 is etched through the aluminum nitride layer 124 and the PE silicon nitride layer 126 and into the oxide film 122. A circular cap 127 is encircled by the recess 128. In FIG. 5J, tungsten material 130 is deposited onto the walls of the annular recess 128. A blanked etch process may be employed to remove tungsten material 130 that resides on the bottom surface of the recess 128. As shown in FIG. 5J, the vertical distance separating the underside of the tungsten 130 and the underside of the nitride layer 124 is about 0.5 mm, for example.

In FIG. 5K, a portion of the PE silicon nitride layer 126 is etched back by an isotropic etch process, and an annular recess 132 having an ovular cross-section is etched into the oxide film 122. The annular recess 132 provides a mold for a gate electrode structure. The size and the cross-sectional shape of the recess 132 may vary from that shown and described. The vertical distance separating the bottom of the tungsten material 130 from the lower surface of the recess 132 is about 0.5 μm, and the horizontal distance separating the tungsten material 130 from the side surface of the recess 132 is about 0.5 μm. Those distances are designated by arrows in FIG. 5k.

In FIG. 5L, CVD tungsten is deposited into the recess 132 to form tungsten gate electrode 134. The top surface of the tungsten gate electrode 134 and the PE silicon nitride layer 126 are then planarized to form a flat surface. In FIG. 5M, the layers of oxide 122, aluminum nitride 124 and PE silicon nitride 126 are etched away by a dry etch process to form a central aperture 136 above the top face of the tungsten post 120.

In FIG. 5N, the entirety of the PE silicon nitride 126 and the portion of the oxide 122 that resides above the poly-silicon film 116 are both etched away by an isotropic etch process. The vertical distance separating the bottom of the aluminum nitride 124 and the lower end of the tungsten gate electrode 134 is about 1 mm, and the diameter of the aperture 136 is about 1.5 mm. The vertical distance separating the bottom of the aluminum nitride 124 and the top surface of the tungsten post 120 may be about 2.5 mm, for example. It should be understood that the aforementioned distances may vary from that shown and described.

In FIG. 5o, a cone-shaped metal tip 138 is deposited on the top surface of the tungsten post 120. The metal tip 138 may be composed of molybdenum (Mo), for example. In FIG. 5P, the sacrificial poly-silicon film 116 and the layer of aluminum nitride 124 are stripped away by a release etch process. The horizontal distance between the central axis of the metal tip 138 and a side surface of the tungsten gate electrode 134 is about 1.75 mm, for example. In FIG. 5Q, the gate electrode 134 is supported by tungsten mesh 140, which remains embedded in the oxide 122 and provides contact to the hold down ring 142. The tungsten mesh 140 is fabricated at the same time as the gate electrode 134, using the same photomasks and films. Because there is no associated tip below the mesh (just thick oxide), electrical breakdown is not expected.

The present invention has been described as an integrated field emission array for ion desorption. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method of semiconductor manufacturing, comprising:
   depositing a top silicon oxide film on a silicon substrate;
   depositing a polysilicon etch-stop film over the top silicon oxide film;
   etching an annular isolation trench through the polysilicon etch-stop film and the top silicon oxide film;
   depositing a silicon nitride layer that overlies the top silicon oxide film and fills the annular isolation trench;
   etching an annular recess through the silicon nitride layer such that the etched annular recess is concentric with and surrounded by the silicon-nitride-filled annular trench in the top silicon oxide film;
   deepening the annular recess by anisotropically etching the polysilicon etch-stop film through the annular recess etched in the silicon nitride layer;
   lining the annular recess with a conformally deposited polysilicon sidewall film;
   etching the top silicon oxide film through the polysilicon-lined annular recess using an isotropic etching process such that an annular cavity having a rounded cross section forms in the top silicon oxide film and partially undercuts the silicon nitride layer; and
   filling the annular cavity in the top silicon oxide film with metal.

2. The method of claim 1, wherein the metal filling the annular cavity comprises tungsten.

3. The method of claim 1, further comprising, before depositing the top silicon oxide film, the following steps directed at forming a silicon post having a sharp tip positioned such that the metal-filled annular cavity is substantially centered about said tip:
   etching an annular post-defining trench in the silicon substrate so as to define a silicon post surrounded by the post-defining trench;
   filling the post-defining trench with a sacrificial fill of silicon oxide;
   depositing a photoresist mask over the silicon post; and
   isotropically etching the silicon post beneath the photoresist mask so as to define the sharp tip.

* * * * *